United States Patent [19]

Morgan

[11] Patent Number: 4,665,382
[45] Date of Patent: May 12, 1987

[54] ANALOG-TO-DIGITAL CONVERSION

[75] Inventor: Harry C. Morgan, Hesperia, Calif.

[73] Assignee: McDonnell Douglas Corporation, Long Beach, Calif.

[21] Appl. No.: 791,746

[22] Filed: Oct. 28, 1985

[51] Int. Cl.$^4$ ............................................. H03M 1/44
[52] U.S. Cl. ............................................. 340/347 AD
[58] Field of Search .................. 340/347 AD, 347 SH

[56] References Cited

U.S. PATENT DOCUMENTS

| | | | |
|---|---|---|---|
| 2,876,418 | 3/1959 | Villars | 340/347 AD |
| 3,500,381 | 3/1970 | Conway | 340/347 AD |
| 4,326,192 | 4/1982 | Merrill | 340/347 AD |
| 4,375,059 | 2/1983 | Schlig | 340/347 AD |

OTHER PUBLICATIONS

Martin "Conference Record of Fifteenth Asilomar Conference on Circuits Systems & Computers" Pacific Grove, Calif., Nov. 9–11, 1981, pp. 489–492.

*Primary Examiner*—Charles D. Miller
*Attorney, Agent, or Firm*—Benjamin Hudson, Jr.; George W. Finch; John P. Scholl

[57] ABSTRACT

There is provided an analog-to-digital conversion technique that utilizes a sample and hold circuit for each bit try stage whereby after the most significant bit try, the remainder is sampled and held by the succeeding stage as an unknown input voltage for comparison with its respective reference voltage representing its corresponding bit weight. Thus, remainders for each bit weight comparison are successively passed from the most significant bit to the least significant bit as input voltages to the next bit try stage. The previous bit stage takes a new sample input voltage and starts another conversion at the next clock pulse. After the first full digital output of the initial conversion, a new digital output word of the successive sampled signal voltage is available after each clock pulse.

3 Claims, 3 Drawing Figures

ANALOG-TO-DIGITAL CONVERSION

BACKGROUND OF THE INVENTION

1. Field of the Invention

This invention relates generally to analog to digital converters, and more particularly to an analog to digital converter having a high speed sampling rate utilizing a sample and hold circuit for each bit resolution that allows the circuit for the most significant bit to start a new conversion at each clock pulse.

2. DESCRIPTION OF THE PRIOR ART

The successive approximation encoding technique is widely used today and is the fastest conventional time serial logic known. More encoders of this type are used in multiplexed analog to digital data systems than in any other kind. These converters compare the analog output of a digital to analog reference converter to an unknown input voltage. Simple digital logic perform the sequential steps.

Starting with the most significant bit, the weight of each binary reference bit is fed to the D/A voltage summer and the output of the D/A is compared against the unknown input voltage. If the D/A output is less than the unknown voltage, the bit is turned off, but if the output is greater than the unknown voltage, then the bit is turned on. This continues until all the reference bits have been compared against the unknown voltage. At the end of the series of bit weight tries, a voltage sum is attained which equals the unknown input analog voltage with an accuracy of ± one half the least significant bit weight. Most successive approximation encoders are closed-loop analog to digital servos consisting of three main elements:

A D/A converter (either resistive, capacitive, or inductive); ladder; an amplifier to detect the difference between input analog voltage and the converter output; and a digital servo.

The comparison amplifier and the D/A converter are the components which introduce errors in A/D conversion. The comparison amplifier is limited in its slew rate. Thus the total A/D speed of conversion time is limited by the slew rate of the comparison amplifier and the D/A conversion rates. It is desirable to increase the conversion rate of analog-to-digital converters to accommodate high frequency signals.

To increase speed, a new analog-to-digital converter technique called a time parallel encoder or flash converter has been developed. The basic principal of the time parallel encoder is quite simple. There is a reference voltage provided for each and every binary value, and detection circuitry for each reference voltage to determine if the unknown analog voltage $V_x$ is within one half a binary increment of each voltage. Since the decisions are essentially in parallel, only one amplifier delay time is required for the binary number decision. The main advantage of these encoders is speed. For example, a four bit ten-ns parallel encoder at a 100 MHz rate is commonly available. The main drawback of these encoders is the large amount of hardware they require for more than three binary bits, although integrated circuits are are easing this problem somewhat.

For an example, in a four significant binary bit encoder, time parallel encoders require 15 different amplifiers, each one with its own reference voltage and its inverting input. The output of all amplifiers must be coded into four-line output codes. Since the encoder is asynchronous, it is better to use Gray code. The encoder also requires feedback logic, for only the highest activated difference amplifier must energize the matrix.

It would be desirable if there were provided an analog-to-digital conversion technique that has a high speed sampling rate, but minimize the logic units required.

SUMMARY OF THE INVENTION

There is provided by this invention, an analog-to-digital conversion technique that improves successive approximation analog-to-digital converters by providing a sample and hold circuit in the logic for each bit stage. This allows the A/D converter to have a much faster sampling rate. Sample and hold circuits store the comparison of the unknown voltage to the weighted value of each bit stage result for use by the successive bit stages which then allows the previous bit stage to take a new sample of the input voltage and start another conversion at the next clock pulse. A memory device stores the digital decision for each bit weight until the least significant bit is tried and the binary output is available. After the first full digital output of the initial conversion, a new digital output word of the successive sampled signal voltage is available after each clock pulse.

BRIEF DESCRIPTION OF THE PREFERRED EMBODIMENT

Figure 1:
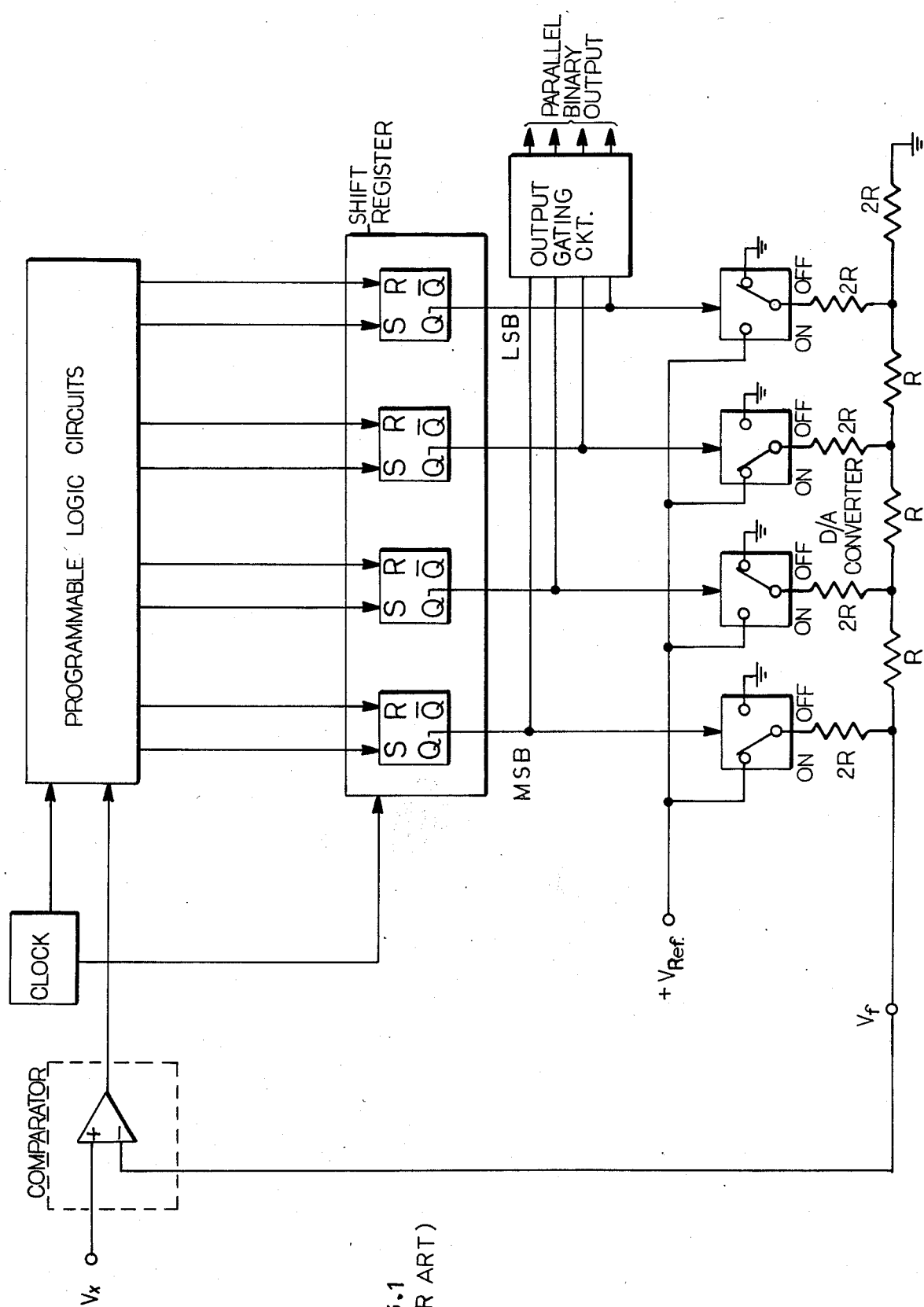
FIGS. 1 and 2 illustrate a prior art circuit and waveforms for a typical analog-to-digital converter.

Referring to FIG. 1, there is shown a schematical representation of a typical prior art analog-to-digital converter that uses the successive approximation technique. It is comprised primarily of a D/A converter 10, a programmed logic module 12, a comparator 14, and a shift register 16. The basic principle is to perform the conversion by comparing the unknown input voltage $V_x$ to a programmed successively better approximation generated by the programmed register and the D/A converter. The most significant bit register is initially set to 1 by the programmer. This generates a voltage via an associated ladder switch at the D/A converter output which is one half of the full scale input voltage. The unknown voltage $V_x$ is compared with this input by the comparator 14. If the input $V_x$ is still larger than the weighted voltage for the most significant bit, the MSB weight is retained in the ladder, and the second most significant bit in the register is set to 1 by its associated bit weight switch and the input is compared with three fourths of the full scale voltage. This continues until each significant bit is compared.

The D/A converter is generally comprised of an R-2R ladder network sometimes referred to as a conductance network, together with a transistor switching circuit such as TS for each stage of the binary bit positions from the most significant bit to the least significant bit. When the switches are on, the ladder network is applied to a voltage reference $V_r$ which generates an output voltage across the load resistor $R_L$ that represents the analog output for the bit weight tried. When conversion begins, the full register is cleared except for the one in the most significant bit position, and the clock is gated to '1' set this first MSB register. The '1' in the most significant bit position causes the most significant bit current which is one half scale to appear across the load resistor $R_L$ to produce an output voltage $\frac{1}{2}V_{ref}$ that is compared with the analog input signal in the comparator 14.

Figure 2:
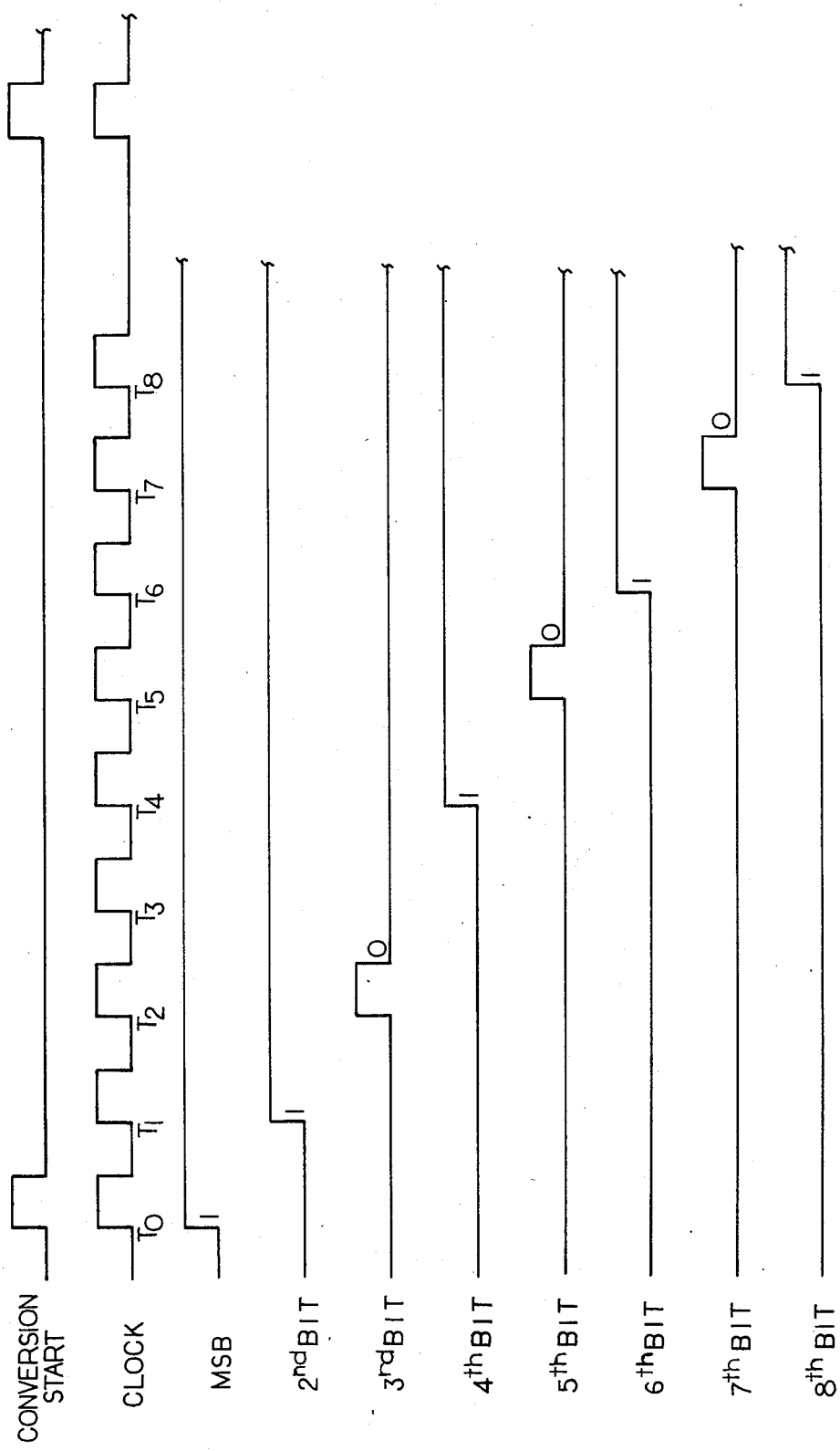

Referring to FIG. 2, if the output of the digital-to-analog converter 10 is less than the single input $V_x$ the comparator output latches the most significant bit at '1' on the next clock pulse, or if the output of the digital-to-analog converter is greater, the comparator signals the most significant bit register to clear and sets a '0' for the most significant bit output. On the next clock pulse the decision of the MSB is latched and Bit 2, which is one fourth of the full scale is added to the DAC output. On the next clock pulse, if the DAC output which is now 75% of full scale, the MSB being '1', is more than the signal, the register latches the second Z most significant bit to a '1', otherwise, if the 75% output of the DAC is less than the signal, the second bit is set to '0' and the third bit, which is one eighth full scale is then added to the DAC output. The process is repeated until the least significant bit has been tried and latched. After the clock pulse occurred and the conversion has been completed, the output gating circuit 18 provides a parallel binary output and the converter is ready for a new conversion.

The speed of conversion of an analog-to-digital converter is limited by the slew rate of the comparison amplifier and the digital-to-analog converter. For the typical analog-to-digital converter such as the one shown in FIG. 1, the sampling of an unknown voltage signal to provide a new $V_x$ for the next conversion is not available until after the least significant bit has been tried. For high frequency signals, such as video signals, the signal level may change during the conversion time and before the next sampling of the input signal. To achieve better approximation of the input signals, electronic designers have been trying to achieve analog-to-digital converters with much faster conversion speeds to accommodate these higher frequency signal levels.

Figure 3:
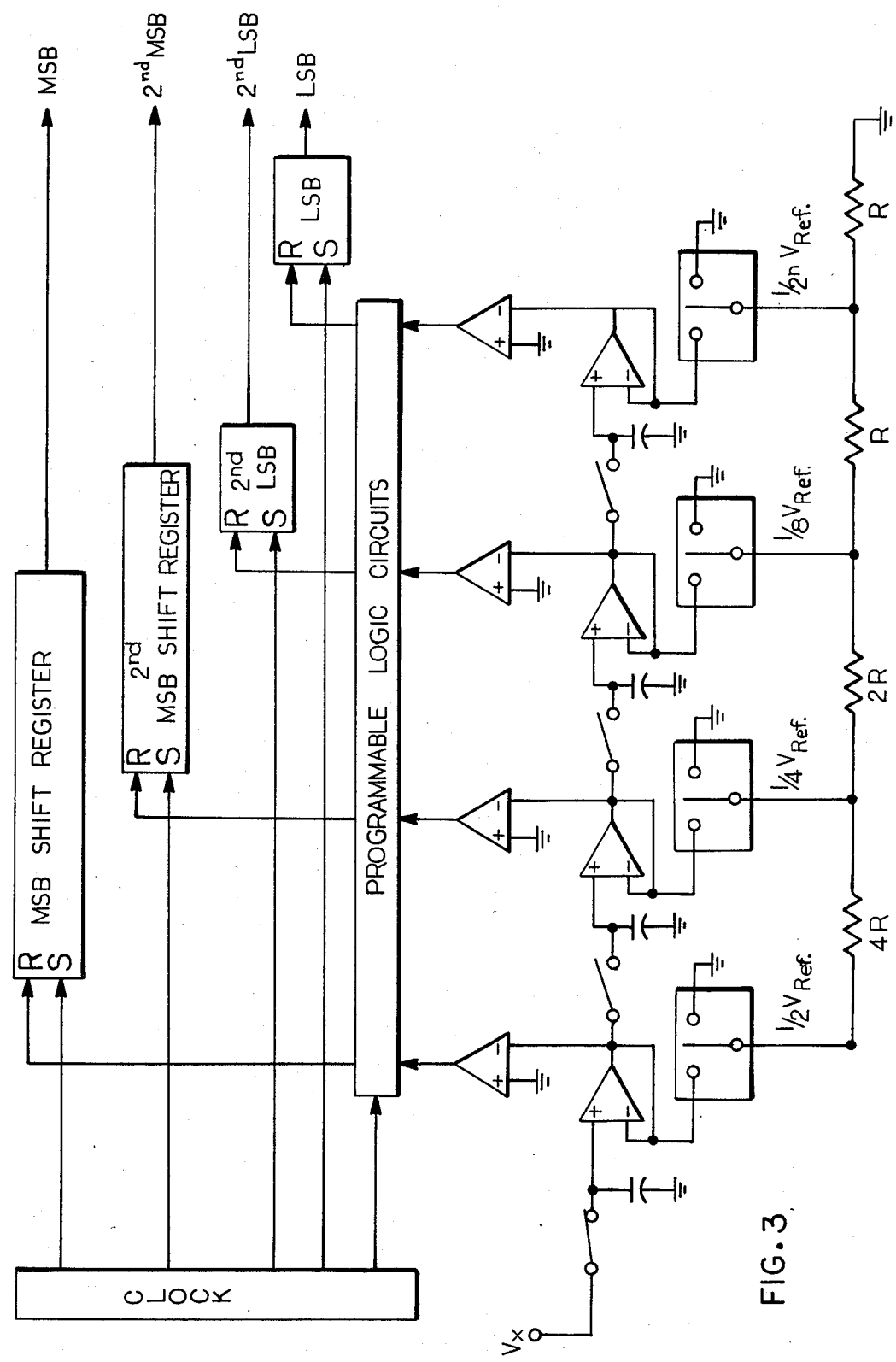
FIG. 3 illustrates a circuit for an analog-to-digital converter incorporating the principles of this invention.

There is shown in FIG. 3 an analog-to-digital converter incorporating the principles of this invention that has a much faster sampling speed than the typical prior art converters such as the one described in FIG. 1. Sample and hold circuits S/H store the comparison of the unknown voltage to the weighted value of each bit stage for result for use by the successive bit stages which then allows the previous bit stage to take a new sample of the input voltage and start another conversion at the next clock pulse. First a reference value of the most significant bit (MSB) weight is compared to the unknown input voltage $V_x$. An associated latch flip-flop is either '1' set if $V_x$ is greater than the most significant bit, or '0' set if it is less. The logic clock rate is either twice the 'bit try' period, or the logic and associated $V_{ref}$ switches use a C1 or $\overline{C1}$. The most significant bit try stage (MSB) and successive odd bit try stages sample the input during the first half of the clock period using C1, and then resets, if the comparator is '0' or negative, the associated flip-flop during the second half of the clock period by means of the $\overline{C1}$. The reference voltage is then either subtracted from the $V_x$ input if $V_x$ is greater than the reference $V_{ref}$ or remains as $V_x$ if less than $V_{Ref}$. This remainder is simplified by the second bit try stage during this same $\overline{C1}$ time interval. Therefore all odd bit try stages sample with the C1 clock and all even bit try stages sample during the $\overline{C1}$ clock period. In descending order, the lesser bit weights are tried and the associated latch set until all bit weights, including the least significant bit (LSB) are tried. The last flip-flops in each bit shift register then have the full digitized value of $V_x$ available for readout in time parallel. The full conversion time for each MSB $V_x$ sampled input is the sum of the times required for each bit weight try, which is equal to the converter clock period times the number of bits in the digitized word. Therefore, an eight-bit digitized word value takes eight clock periods. There is an eight-bit delay at start-up before the first full parallel conversion is available and an eight bit delay between the time of the MSB try and the LSB try when the full eight-bit conversion can be read out. However, after the first word is read out, a full eight-bit word is available after each clock period. The clock period can be no shorter than the time required for the MSB comparison. This time is usually the complex sum of the bit weight switching time and the response time of the comparison amplifier. The complex sum of both time constants is not an algebraic sum but a vector sum which is less than the algebraic sum but somewhat greater than the longest time constant of either component. While the lesser bits require somewhat less time, uniform clock periods are more conveniently used in the conventional logic design practice.

An eight-bit word is available after each bit weight try because sample and hold circuits S/H are added that store the remainder of the previous bit weight try for use as an input to the next sample and hold bit try stage. The summing sample and hold circuit holds the value of $V_x$ less the value of the bit weight if it is smaller than $V_x$ or $V_x$ if $V_x$ is greater than its associated reference voltage. Each bit weight try stage has a sample and hold amplifier which holds the input voltage passed to it from the previous bit try circuit. Input switches are closed to sample the voltage from the previous stage and then opened to hold the voltage and isolate the sample and hold while the previous circuit accepts a new unknown voltage. The logic thus acts as a "bucket brigade" where the remainder is passed down the line with the reference voltage subtracted until there is no reference voltage greater than half the least significant bit (LSB). Each bit weight try decision is set into the input of a shift register which pipelines the information downline so that the full conversion digital word is available at the end of the conversion process for parallel readout. The MSB shift register has the same number of stages as the digital word, each succeeding shift register has one less flip-flop, and the LSB has only one RS flip-flop so that for an eight bit converter 36 flip-flops are required. The formula for the pipeline flip-flops required is the number of flip-flops equal to $(N+1)N/2$ where N is the number of bits in the conversion word. After the first full conversion time, the subsequent conversion readouts are now available in the time it takes the logic to make one bit try, or one clock period. However, it still takes the same number of clock periods (as a delay time) before the conversion is available for readout after the first MSB sampled voltage. Note again that instead of a single conversion being made by a successive approximation analog-to-digital converter, eight full conversions are made for an eight bit high speed analog-to-digital converter. The resistance ladder shown in FIG. 3 is not the constant conductance ladder shown in FIG. 1, but is a voltage reference ladder with voltage taps. The voltage taps represent $\frac{1}{2}V_{ref}, \frac{1}{4}V_{ref}, \ldots \frac{1}{2^n}V_{ref}$.

It can readily be seen that there is provided by this invention a novel analog-to-digital conversion technique that provides a much faster sampling rate by storing each bit try comparison in a sample and hold circuit for use as the input of the succeeding bit circuits.

What I claim is:

1. An analog-to-digital converter, comprising:
   (a) A digital-to-analog converter for generating a multitude of reference voltages representing the bit weights from the most significant bit to the least significant bit;
   (b) A first stage sample and hold means for sampling an unknown input voltage;
   (c) A first stage comparator means connected to the output of the first stage sample and hold means for comparing the unknown input voltage to a reference voltage corresponding to the most significant bit;
   (d) Cascaded stages of comparator means from the most significant bit to the least significant bit for comparing the remainder of the preceding stage sample and hold means to the reference voltage representing the bit weight of the next most significant bit, each stage having a sample and hold means connected to the output of the sample and hold of the preceding stage, and each stage holding the remainder voltage of the preceding stage as an unknown input voltage to the comparator means for comparison with the reference voltage representing its corresponding bit weight;
   (e) A programmable logic means including a clock and timing generator for controlling the timing and sequence of operations of each comparison of the unknown input voltage beginning with the most significant bit to the least significant bit and generating a digital binary number for each bit; and
   (f) A digital memory means connected to the programmable logic means for storing the digital conversion of the each comparator means until the conversion of the least significant bit.

2. An analog-to-digital converter as recited in claim 1 wherein the cascaded stages of comparator means is comprised of a transistor switched resistive ladder network.

3. An analog-to-digital converter as recited in claim 1 wherein the the first stage sample and hold means samples a new unknown voltage after each clock gated output of the first stage comparator means to start a new conversion sequence.

* * * * *

UNITED STATES PATENT AND TRADEMARK OFFICE
CERTIFICATE OF CORRECTION

PATENT NO. : 4,665,382

DATED : 12 May 1987

INVENTOR(S) : Harry C. Morgan

It is certified that error appears in the above—identified patent and that said Letters Patent is hereby corrected as shown below:

Column 3, line 17, "Z" should be omitted after the word "second".

Signed and Sealed this

Twenty-seventh Day of October, 1987

Attest:

DONALD J. QUIGG

Attesting Officer

Commissioner of Patents and Trademarks